(12) United States Patent
Morand et al.

(10) Patent No.: US 11,217,571 B2
(45) Date of Patent: Jan. 4, 2022

(54) POWER MODULE AND METHOD FOR MANUFACTURING POWER MODULE

(71) Applicant: MITSUBISHI ELECTRIC CORPORATION, Tokyo (JP)

(72) Inventors: Julien Morand, Rennes (FR); Remi Perrin, Rennes (FR); Roberto Mrad, Rennes (FR); Jeffrey Ewanchuk, Rennes (FR); Stefan Mollov, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/977,172

(22) PCT Filed: Mar. 5, 2019

(86) PCT No.: PCT/JP2019/009551
§ 371 (c)(1),
(2) Date: Sep. 1, 2020

(87) PCT Pub. No.: WO2019/188153
PCT Pub. Date: Oct. 3, 2019

(65) Prior Publication Data
US 2021/0043613 A1 Feb. 11, 2021

(30) Foreign Application Priority Data

Mar. 30, 2018 (EP) .................................... 18305374

(51) Int. Cl.
*H01L 25/11* (2006.01)
*H01L 25/18* (2006.01)
*H01L 25/00* (2006.01)

(52) U.S. Cl.
CPC ............ *H01L 25/115* (2013.01); *H01L 25/18* (2013.01); *H01L 25/50* (2013.01)

(58) Field of Classification Search
CPC ............ H01L 2924/00014; H01L 2224/27312
See application file for complete search history.

(56) References Cited

U.S. PATENT DOCUMENTS

| 8,823,175 B2 | 9/2014 | Bayerer |
| 10,782,338 B2 * | 9/2020 | Degrenne .......... G01R 31/2818 |

(Continued)

FOREIGN PATENT DOCUMENTS

DE 10 2008 040 906 A1 2/2010

*Primary Examiner* — Thao P Le
(74) *Attorney, Agent, or Firm* — Birch, Stewart, Kolasch & Birch, LLP

(57) ABSTRACT

A power module (1) is disclosed, comprising:
first and second substrates (10), each substrate patterned layer of electrically conductive material (12),
a plurality of pre-packed power cells (20), positioned between the substrates, each cell comprising:
an electrically insulating core (21) embedding at least one power die (22), and
two external layers (23) of electrically conductive material on opposite sides of the electrically insulating core (21), said external layers being respectively connected to each patterned layers of the substrates,
wherein each external layer of a pre-packed power cell comprises a contact pad (230) connected to a respective contact (220) of the power die through connections arranged in the electrically insulating core (21), said contact pad having a surface area greater than the surface area of the power die electrical contact to which it is connected.

15 Claims, 3 Drawing Sheets

(56) References Cited

U.S. PATENT DOCUMENTS

| | | |
|---|---|---|
| 2008/0054425 A1 | 3/2008 | Malhan et al. |
| 2013/0008102 A1* | 1/2013 | Bindschedler ........ E04D 11/007 52/173.3 |
| 2020/0412354 A1* | 12/2020 | Morand .................. H02M 1/08 |
| 2021/0028135 A1* | 1/2021 | Said ....................... B82Y 10/00 |
| 2021/0028136 A1* | 1/2021 | Said ....................... H01L 25/105 |
| 2021/0143103 A1* | 5/2021 | Mrad ................. H01L 23/49833 |
| 2021/0217716 A1* | 7/2021 | Wu ........................ H01L 25/50 |
| 2021/0233881 A1* | 7/2021 | Said ........................ H01L 24/08 |

* cited by examiner

POWER MODULE AND METHOD FOR MANUFACTURING POWER MODULE

TECHNICAL FIELD

The invention relates to a power module comprising two substrates and a plurality of pre-packed power cells positioned between the substrates, each pre-packed power cell comprising at least one power die. The invention also relates to a manufacturing method of such a power module.

BACKGROUND ART

Power dies, such as diodes or various types of power transistors (MOSFET, JFET, IGBT, HEMT) are elementary components of power modules which are used for the control and conversion of electric power, for instance in many different fields such as in the automotive, aeronautic, railway industries. Power dies are vertically constructed as opposed to signal conditioning die that are usually built in a transversal manner. As a result the die has electrical connections on each side of it.

Currently the most common way to connect a power die to other components, for instance in a power module, is by using a substrate such as a Direct Bonded Copper (DBC) Substrate, which comprises a ceramic plate with at least one side covered with a copper layer. Power dies are soldered or sintered on the Substrate on one side, and connected on the other side of the die by wire bond or ribbons that are ultrasonically welded on the die metallization.

The constant increase in the switching frequency allows a volume reduction of the whole converter. This downsizing leads to a concentration of the power in reduced volume. The heat density is therefore further increased. All these evolutions converge to a need for thermal enhancement, and reliability increase of the power modules.

In order to enhance thermal dissipation in a power module comprising a plurality of power dies, it has already been proposed power modules comprising two cooling substrates such as DBCs between which are sandwiched the power dies. This is for instance the case in document U.S. Pat. No. 6,072,240, disclosing a plurality of IGBT dies positioned between two substrates.

The main advantage of these power modules is their good capability of dissipating heat by double sided cooling.

However the existing double sided cooling solutions are not devoid of drawbacks. First, by using sintering technology, bonding dies between two substrates requires exerting a pressure on the substrates and on the dies. As the dies are very fragile, one must take care to properly distribute the pressure on the surface of the substrates not to break any of the dies positioned in between.

Second, the die thickness is usually different between various types of power dies, for instance between diodes and power switches. Due to this thickness difference, the second substrate cannot be directly bonded to the upper side of the dies. In order to accommodate these thickness variations, some solutions have been proposed in which the substrates are not planar and exhibit raised regions or posts, such as in document US2011/0254177. Because of the dimensions tolerances or each part, such a module is however complex to design and manufacture.

It has also been proposed power modules in which interfaces between the dies and the second substrates are made by bumps sintered on the dies and substrates, with the size of the bumps accommodating thickness variations between the dies. In this kind of solution, the bumps also act like spacers in order to ensure the functional electrical insulation. If the substrates were only separated by the thickness of the dies, which is in average of about 0.5 mm, the functional insulation could not be ensured. Moreover, the added shims requires to be soldered on the die and on a substrate adding a solder layer that will increase thermal stress and deteriorate the thermal conductivity.

However, these solutions do not solve another problem which resides in the very limited size of the power dies electrical contacts. For instance, the transistor control pad (gate or base) are much smaller than the one power ones. It is therefore particularly difficult to connect it to the substrate. In particular with wide bandgap devices, the gate connections require high precision parts and accurate alignments, which in turn involve expensive equipment and present a high yield risk.

In view of this problem, the above-described solutions are still not currently commercially available, and the double sided modules found in literature are limited to big feature size like IGBT chips or diodes, and are not adapted to any kind of power dies.

In the publication by C. DiMarino et al. "Design of a novel, high-density, high-speed 10 kV SiC MOSFET module", in 2017 IEEE Energy Conversion Congress and Exposition (ECCE), 2017, pp. 4003-4010, the size problem of the gate pad of a SiC MOSFET has been addressed by enlarging the gate pad to permit the connection with a Molybdenum shim. This solution however requires an extensive modification of the die metallization, whereby the efficient heat and current transfer is compromised.

SUMMARY OF INVENTION

In view of the above, the invention aims at providing a power module with efficient cooling and high reliability.

Another aim of the invention is to provide a power module having double-sided cooling with an easier die attach while ensuring the required electrical insulation between opposite substrates.

Another aim of the invention is to provide a power module which is easier to manufacture than in the prior art.

Accordingly, a power module is disclosed, comprising:
  first and second planar substrates, each substrate comprising a layer of thermally conductive material and a patterned layer of electrically conductive material,
  a plurality of pre-packed power cells, positioned between the first and second planar substrates, each pre-packed power cell comprising:
    an electrically insulating core,
    at least one power die embedded in the electrically insulating core, each power die having opposite electrical contacts, and
    two external layers of electrically conductive material on opposite sides of the electrically insulating core, said external layers being respectively connected to each patterned layers of electrically conductive material of the planar substrates,
wherein each external layer of electrically conductive material of a pre-packed power cell comprises a contact pad connected to a respective electrical contact of the power die through connections arranged in the electrically insulating core of the pre-packed power cell, said contact pad having a surface area greater than the surface area of the power die electrical contact to which it is connected.

In embodiments, each pre-packed power cell further comprises two internal layers of electrically conductive material embedded in the electrically insulating core, each internal layer being positioned between the power die and a respective external layer, the thickness of the external layers being greater than the thickness of the internal layers, and the connections between said contact pad of an external layer and a respective electrical contact of the power die comprise first connections between said contact pad of the external layer and a contact pad of a respective internal layer, and second connections between said contact pad of the respective internal layer and the respective electrical contact of the power die.

The surface area of the contact pad of the internal layer of electrically conductive material may then be greater than the surface area of the power die electrical contact to which it is connected.

The connections between an external layer and an internal layer of a pre-packed power cell, and the connections between an internal layer and an electrical contact of a power die may be vias arranged in the electrically insulating core.

In embodiments, the power module further comprises a layer of electrically and thermally conductive bonding material between each external layer of a pre-packed power cell and the patterned layers of the substrates, said bonding material being chosen among the group consisting of: solder, sinter, of conductive paste.

According to an embodiment, the power module may further comprise dielectric material filling the spaces located between the substrates and between the pre-packed power cells.

Preferably, at least two power dies incorporated in different pre-packed power cells have different thicknesses, measured as the maximum distance between electrical contacts on opposite sides of the power dies, and the corresponding pre-packed power cells have equal thicknesses measured between their respective two external layers of electrically conductive material. The planar substrates may be Direct Bonded Copper Substrates, Insulated Metal Substrates or Active Metal Brazed Substrates.

In embodiments, the power module further comprises at least one passive component mounted on the patterned layer of electrically conductive material of one of the substrates.

The substrates may further comprise power terminals, an output terminal and control terminals of the power dies, said terminals being electrically connected to the patterned layers of electrically conductive material.

A method for manufacturing a power module according to the above description is also disclosed, comprising:
  providing two substrates, each substrate comprising a layer of thermally conductive material and a patterned layer of electrically conductive material having contact pads,
  placing pre-packed power cells between the two substrates, wherein each pre-packed cell comprises a power die embedded in an electrically insulating core and connected to external layers of electrically conductive material having contact pads, such that the contact pads of the external layers of each pre-packed power cell match contact pads of the patterned layers of the substrates,
wherein bonding material is present on the external layers of electrically conductive materials of the power cells or on the patterned layers of electrically conductive material,
  bonding together the substrates and pre-packed power cells.

The method may comprise another step of filling the remaining spaces between the substrates and between the pre-packed power cells by dielectric material.

The method may also further comprise, prior to the bonding step, a step of mounting at least one passive component on one of the patterned layers of electrically conductive material of the substrates.

The bonding material may be applied by screen printing or nozzle deposition.

The method may further comprise a preliminary step of manufacturing the pre-packed power cells, such that all the pre-packed power cells have the same thickness.

The power module according to the invention provides a good thermal dissipation thanks to the two substrates that are attached on opposite sides of pre-packed power cells. The incorporation of pre-packed power cells between the substrates allows ensuring the required electrical insulation because the power cells act as spacers between the substrates, and also because they comprise a core of electrically insulating material.

In addition, the use of pre-packed power cells makes possible the connections to the small electrical pads of the power dies, as the contact pads of the substrates can be connected to enlarged contact pads of the power cells playing the role of a fanout package In order to further enhance thermal dissipation and electrical insulation, the space of the power module between the substrates and between the pre-packed power cells may also be filled by electrically insulating and thermally conductive material.

Other features and advantages of the invention will be apparent from the following detailed description given by way of non-limiting example, with reference to the accompanying drawings.

BRIEF DESCRIPTION OF DRAWINGS

FIG. 2b is an enlarged view of a part of the power module of FIG. 2a.

DESCRIPTION OF EMBODIMENTS

Figure 1:
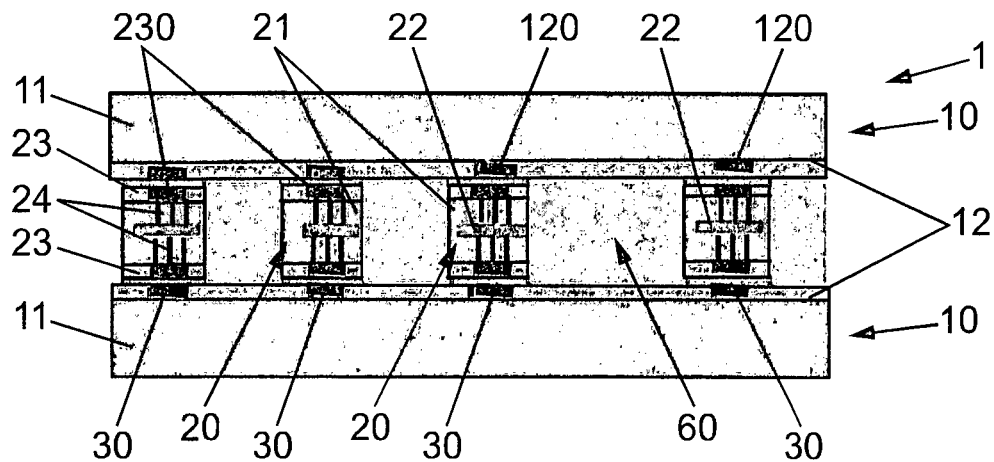
FIG. 1 is a schematic representation of a power module according to an embodiment of the invention.

With reference to FIG. 1, a power module 1 according to an embodiment of the invention will now be described.

The power module 1 comprises two substrates 10, each comprising at least a layer of thermally conductive material 11, which is also an electrically insulating material, on which is disposed a patterned layer 12 of electrically conductive material. The substrates 10 may for instance be Direct Bonded Copper (DBC) substrates, in which a patterned layer 12 of copper is arranged on a ceramic plate 11 (for example made of alumina) forming the thermally conductive and electrically insulating layer. According to other examples, the substrates 10 may be Insulated Metal substrates (IMS), or Active Metal Brazed (AMB) substrates.

The power module 1 further comprises a plurality of pre-packed power cells 20, positioned between the two substrates 10, wherein the two patterned layers 12 of electrically conductive material are positioned towards one another. Each pre-packed power cell 20 comprises at least an electrically insulating core 21, in which is embedded at least one power die 22. The power die may be a diode or a transistor such as a MOSFET, JFET or IGBT, HEMT. In embodiments, the power die 22 is made from a wide bandgap semiconductor, i.e. a semiconductor having a bandgap in the range of 2-4 eV. For instance, the power die may be made in Silicon Carbide SiC or in Gallium Nitride GaN.

Figure 2A:
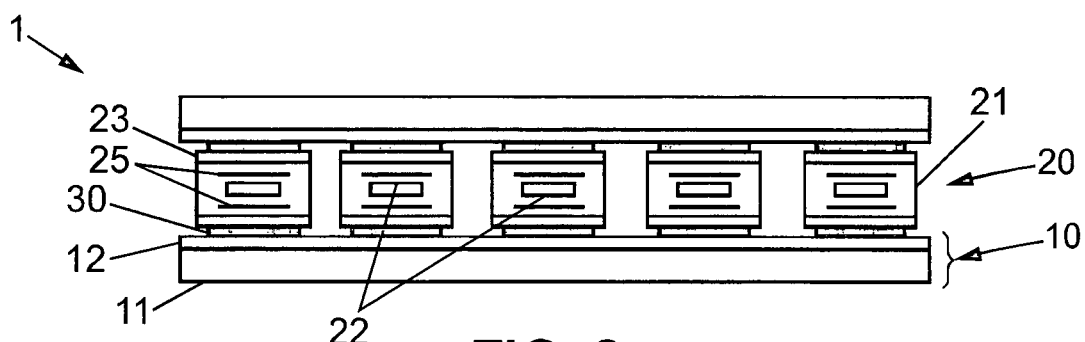
FIG. 2a is a schematic representation of a power module according another embodiment of the invention.
Figure 2B:
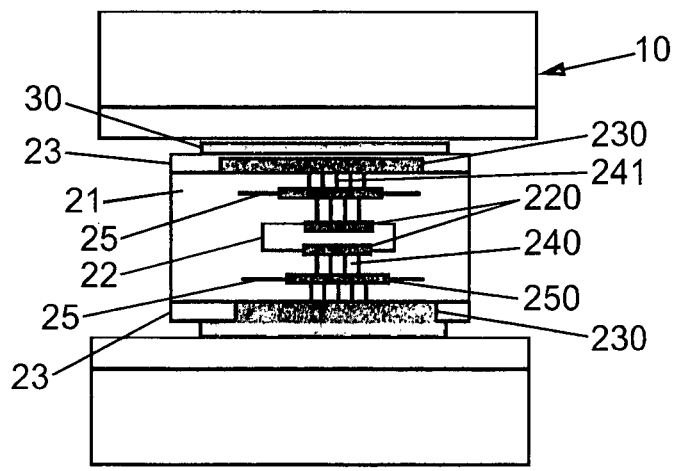

The power die has electrical contacts 220 on opposite sides thereof (FIG. 2b). In an embodiment, the power die 22 is a diode and has two opposite electrical contacts 220. In another embodiment, the power die 22 is a transistor and has three electrical contacts 220 comprising a gate, a source and a drain or a gate, an emitter and a collector, according to the type of transistor. The power die 22 could also have a number of electrical contacts greater than three.

The electrically insulating core 21 of the pre-packed power cell 20 has preferably a low thermal resistance to provide better heat dissipation. The electrically insulating core 21 may be made of FR-4 glass epoxy, polyimide, or in ceramic such as HTCC (High-Temperature Co-Fired Ceramic) or LTCC (Low Temperature Co-fired Ceramic).

In addition, the pre-packed power cell 20 further comprises two external layers 23 of electrically conductive material (e.g. copper), on opposite main surfaces of the electrically insulating core 21. Therefore the two external layers 23 of a pre-packed power cell 20 are in contact with a respective electrically conductive layer 12 of the substrates 10 when the cell 20 is positioned between the substrates.

Each external layer 23 is patterned to match the pattern of the electrically conductive layers 12 of the substrates 10, either by etching or milling. To this end, each external layer comprises at least one contact pad 230 which is configured to match a contact pad (not shown) of one of the electrically conductive layers when the pre-packed power cell is inserted between the substrates 10. Furthermore, the contact pad 230 of the external layer 23, or another contact pad of the same layer, connected to the first and at the same potential, is also connected to a respective electrical contact 220 of the power die 22.

Therefore a connection is established between the patterned electrically conductive layers 12 of the substrates 10 and the power dies 22.

The power module thus can comprise a plurality of power dies 22 integrated in respective power cells (each power cell can comprise one or more power dies), and connecting the power cells according to the needed topology of the power module. For instance, the power module can be an inverter or a DC/DC converter.

In an embodiment shown schematically in FIG. 1, the contact pads 230 of the external layers of a pre-packed power cell 20 are connected to the respective electrical contacts of the power dies by vias 24 arranged in the electrically insulating core 21.

In another embodiment shown schematically in FIGS. 2a and 2b, the pre-packed power cell 20 further comprises at least two internal layers 25 of electrically conductive material (e.g. copper), each layer being embedded in the electrically insulating core 21 and being positioned between the power die and a respective external layer 23. In that case, each internal layer 25 comprises at least one contact pad 250 connected to a respective electrical contact of a power die by vias 240 arranged in the electrically insulating core 21, and a contact pad 230 of an external layer 23 is connected to a contact pad of a respective internal layer 25 by other vias 241 arranged in the electrically insulating core 21. The contact pad 230 of an external layer 23 is therefore connected to an electrical contact of the power die by means of the internal layer 25 positioned in between.

Preferably, the surface area of the contact pad 230 of an external layer is greater than a surface area of the power die electrical contact 220 to which it is connected. Therefore, the use of a pre-packed power cell allows enlarging the contact surface area of the power die thanks to the enlarged contact pads 230 of the external layers.

In the embodiment in which a pre-packed power cell 20 further comprises internal layers of electrically conductive material 25 having respective contact pads 250, the surface area of a contact pad 250 of an internal layer 25 is greater than the surface area of the electrical contact of the power die to which it is connected, and can be smaller or have the same surface area than the surface area of a contact pad 230 of the external layer to which it is also connected.

Hence, there is in any case an increase in the surface area between the electrical contacts of the power die and the external layer 23 contact pads 230.

This makes the assembly and connection of the pre-packed power cells 2 with the substrates 10 easier, and also allows a transmission of high-power to the die 22.

In the embodiment in which the pre-packed power cell 20 comprises internal layers 25 of electrically conductive material, the external layers may have a thickness greater than the thickness of the internal layers 25, for instance at least five or ten times greater, in order to increase power transmission to the power die. According to a non-limiting embodiment, the internal layers 25 may have a thickness of about 30-35 μm, and the external layers 23 may have a thickness of about 400 μm.

In order to accommodate enough power transmission, the density of vias 240 connecting a power die electrical contact with an internal layer contact pad may be at least 20 vias/mm$^2$, for instance 30 vias/mm$^2$, for instance with a ratio vias hole depth to drill diameter of 1:2.5.

The density of vias 241 connecting a contact pad 250 of an internal layer with a contact pad of an external layer may be equal or below 30 vias/mm$^2$, due to the more important surface area of the contact pad of the external layer; for example, with a ratio vias hole depth to drill diameter of 1:1.

Each pre-packed power cell is attached to the substrates 10 of the module 1 either by sintering, soldering or liquid diffusion bonding technics, as will be described in more details below. Therefore the module 1 further comprises between each external layer 23 of a pre-packed power cell 20 and the electrically conductive layer 12 of a substrate, a layer of bonding material 30 such as solder paste, sintering paste (for instance Ag sintering paste), or conductive paste.

As the thickness of various power dies can be variable, the thickness being the distance between the opposite electrical contacts of a power die, all the pre-packed power cells of a same power module 1 and incorporating power dies of varying thicknesses preferably have the same thickness, measured as the distance between the external layers 23 of the power cell. In order to accommodate the thicknesses variations between the power dies, the power cells may have a constant thickness of the electrically insulating core, which is determined so as to be sufficient to embed any of the power dies and so as to ensure a sufficient electrical isolation between both substrates 10.

The thickness of the electrically insulating core 21 is thus determined as the minimum thickness to embed the power die of maximum thickness and to provide electrical isolation between the substrates. Therefore, the thickness variations of the power dies are compensated by the power cells and hence the design and manufacturing of the power modules are easier.

The thickness of a power cell, exceeding that of a power die, also allows creating a sufficient space between the substrates 10 to provide the required electrical insulation between them.

Figure 3A:
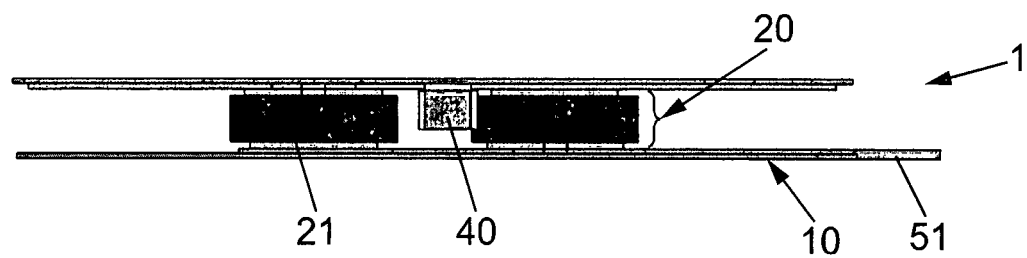
FIG. 3a is a schematic view of a power module according to another embodiment of the invention.
Figure 3B:
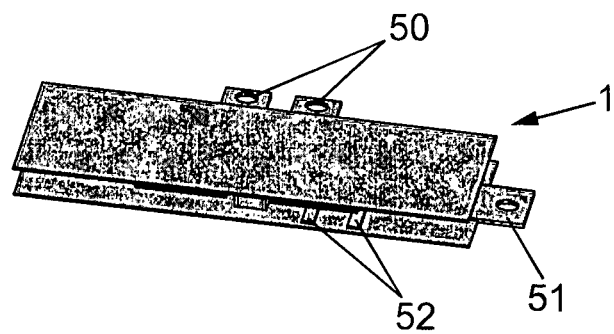
FIG. 3b is a schematic view of a power module according to another embodiment of the invention.

As shown for instance in FIGS. 3a and 3b, the power module 1 may also comprise additional, passive components 40 such as decoupling capacitors or gate resistors, which can be bounded to one electrically conductive layer 12 of one of the substrates.

The power module 1 also comprises terminals which can be part of one or more lead frame(s) soldered on the electrically conductive layers 12. Said terminals comprise power terminals 50, an output terminal 51 and control terminals 52 of the dies. Drivers may be soldered on one of the electrically conductive layers and connected to the control terminals, or may be incorporated in a power cell along with the power dies they are meant to control in order to reduce the distance between a driver and the power die.

Last, the power module 1 preferably further comprises dielectric material 60 filling the gaps between the substrates 10 and between the power cells and other components contained in the module. It can be FR-4 glass epoxy, parylene or silicone. Preferably, the dielectric material has a thermal conductivity greater than at least 1 W/(m·K), in order to enhance thermal dissipation while also increasing electrical insulation between the substrates 10.

Figure 4:
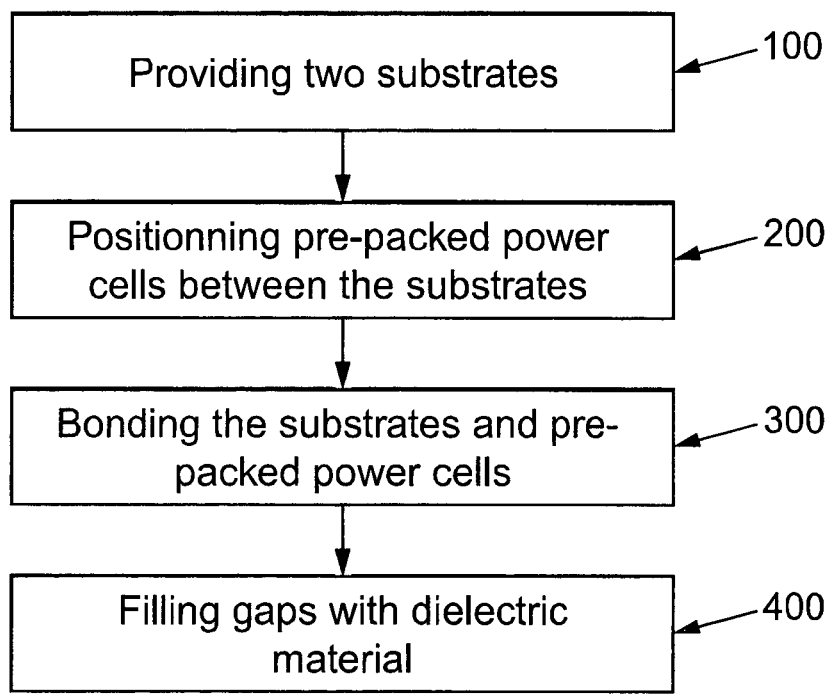
FIG. 4 schematically represents the main steps of a manufacturing method according to an embodiment of the invention.

With reference to FIG. 4, a manufacturing method of the power module 1 described above will now be explained.

The method comprises a first step 100 of providing two substrates 10 having a layer 11 of electrically insulating, thermally conductive material, and a patterned layer 12 of electrically conductive material. The pattern is done by milling or etching. In embodiments, at least one passive component such as a capacitor may be attached to one of the substrates, for example by soldering. The mounting of a passive component can also be done after step 200 is performed.

During a second step 200, a plurality of pre-packed power cells 20 according to the description above are positioned between the substrates such that each patterned layer 12 of a substrate 10 is facing an external layer 23 of a power cell, and such that the contact pads of the patterned layers match the contact pads of the external layers 23.

This step if easier to perform than positioning power dies directly on a substrate, as the external contact pads (formed by the contact pads of the external layers) of a pre-packed power cell are larger than the electrical contacts of a power die.

Preferably, before step 200 bonding material 30 is applied on the contact pads of at least one of the external layers 23 and of the patterned layers 12 of the substrates. Preferably, the bonding material is applied on both contact pads of the external layers and of the patterned layers 12. The bonding material may be solder paste or sintering paste or conductive paste. It may be applied by screen printing or nozzle deposition.

Then the method comprises a step 300 of bonding the substrates with the pre-packed power cells 20. In case of sintering, the two substrates may be pressed together with heat. Since the distance between the two substrates is ensured by the pre-packaged cells, there is no risk of tilting or unbalanced pressure over the surface.

In case of soldering, the position of a substrate regarding each contact pad of a pre-packed power cell may be corrupted by surface tension force resulting by the phase change of solder paste. In this case an additional dowel pin (not shown) can be used to keep in place the assembly of substrates and power cells.

A lead frame supporting at least one terminal may also be attached to at least one of the substrates by soldering or sintering for providing at least some of the modules terminals. The bonding of this lead frame may also be performed prior to the bonding of the pre-packed power cells with the substrates.

Optionally, during a step 400, the remaining gaps between the substrates and between the components (power cells and/or passive components) may be filled by inserting the dielectric filling material in order to enhance thermal dissipation and electrical insulation between the substrates.

The invention claimed is:

1. A power module, comprising:
first and second planar substrates, each substrate comprising a layer of thermally conductive material and a patterned layer of electrically conductive material,
a plurality of pre-packed power cells, positioned between the first and second planar substrates, each pre-packed power cell comprising:
an electrically insulating core,
at least one power die embedded in the electrically insulating core, each power die having opposite electrical contacts, and
two external layers of electrically conductive material on opposite sides of the electrically insulating core, said external layers being respectively connected to each patterned layers of electrically conductive material of the planar substrates,
wherein each external layer of electrically conductive material of a pre-packed power cell comprises a contact pad connected to a respective electrical contact of the power die through connections arranged in the electrically insulating core of the pre-packed power cell, said contact pad having a surface area greater than the surface area of the power die electrical contact to which it is connected.

2. The power module according to claim 1, wherein each pre-packed power cell further comprises two internal layers of electrically conductive material embedded in the electrically insulating core, each internal layer being positioned between the power die and a respective external layer, the thickness of the external layers being greater than the thickness of the internal layers,
and the connections between said contact pad of an external layer and a respective electrical contact of the power die comprise first connections between said contact pad of the external layer and a contact pad of a respective internal layer, and second connections between said contact pad of the respective internal layer and the respective electrical contact of the power die.

3. The power module according to claim 2, wherein the surface area of the contact pad of the internal layer of electrically conductive material is greater than the surface area of the power die electrical contact to which it is connected.

4. The power module according to claim 1, wherein the connections between an external layer and an internal layer of a pre-packed power cell, and the connections between an internal layer and an electrical contact of a power die are through-vias arranged in the electrically insulating core.

5. The power module according to claim 1, further comprising a layer of electrically and thermally conductive bonding material between each external layer of a pre-packed power cell and the patterned layers of the substrates, said bonding material being chosen among the group consisting of: solder, sinter, of conductive paste.

6. The power module according to claim 1, further comprising dielectric material filling the spaces located between the substrates and between the pre-packed power cells.

7. The power module according to claim 1, wherein at least two power dies incorporated in different pre-packed power cells have different thicknesses, measured as the maximum distance between electrical contacts on opposite sides of the power dies, and the corresponding pre-packed power cells have equal thicknesses measured between their respective two external layers of electrically conductive material.

8. The power module according to claim 1, wherein the planar substrates are Direct Bonded Copper Substrates, Insulated Metal Substrates or Active Metal Brazed Substrates.

9. The power module according to claim 1, further comprising at least one passive component mounted on the patterned layer of electrically conductive material of one of the substrates.

10. The power module according to claim 1, wherein the substrates further comprise power terminals, an output terminal and control terminals of the power dies, said terminals being electrically connected to the patterned layers of electrically conductive material.

11. A method for manufacturing a power module according to claim 1, comprising:
   providing two substrates, each substrate comprising a layer of thermally conductive material and a patterned layer of electrically conductive material having contact pads,
   placing pre-packed power cells between the two substrates, wherein each pre-packed cell comprises a power die embedded in an electrically insulating core and connected to external layers of electrically conductive material having contact pads, such that the contact pads of the external layers of each pre-packed power cell match contact pads of the patterned layers of the substrates,
wherein bonding material is present on the external layers of electrically conductive materials of the power cells or on the patterned layers of electrically conductive material,
   bonding together the substrates and pre-packed power cells.

12. The method according to claim 11, further comprising filling the remaining spaces between the substrates and between the pre-packed power cells by dielectric material.

13. The method according to claim 11, further comprising, prior to the bonding, mounting at least one passive component on one of the patterned layers of electrically conductive material of the substrates.

14. The method according to claim 11, wherein the bonding material is applied by screen printing or nozzle deposition.

15. The method according to claim 11, further comprising a preliminary manufacturing the pre-packed power cells, such that all the pre-packed power cells have the same thickness.

* * * * *